(12) United States Patent
Basol

(10) Patent No.: US 6,833,063 B2
(45) Date of Patent: Dec. 21, 2004

(54) ELECTROCHEMICAL EDGE AND BEVEL CLEANING PROCESS AND SYSTEM

(75) Inventor: Bulent M. Basol, Manhattan Beach, CA (US)

(73) Assignee: Nutool, Inc., Milpitas, CA (US)

( * ) Notice: Subject to any disclaimer, the term of this patent is extended or adjusted under 35 U.S.C. 154(b) by 75 days.

(21) Appl. No.: 10/032,318

(22) Filed: Dec. 21, 2001

(65) Prior Publication Data

US 2003/0116444 A1 Jun. 26, 2003

(51) Int. Cl.[7] .................. C25D 17/00; C25D 5/02; C25D 5/08; C23F 1/00; C25F 1/00
(52) U.S. Cl. .................. 205/668; 204/224 M; 216/92; 216/105; 205/672; 205/123; 205/133; 205/137; 205/157; 205/223; 205/291
(58) Field of Search .................. 205/87, 123, 133, 205/137, 157, 210, 223, 291, 668, 672, 674, 686; 204/224 M, 224 R; 216/92, 105

(56) References Cited

U.S. PATENT DOCUMENTS

| | | | |
|---|---|---|---|
| 5,865,984 A | 2/1999 | Corbin, Jr. et al. | 205/670 |
| 6,056,869 A * | 5/2000 | Uzoh | 205/771 |
| 6,309,981 B1 | 10/2001 | Mayer et al. | 438/754 |
| 6,352,623 B1 * | 3/2002 | Volodarsky et al. | 204/275.1 |
| 6,610,190 B2 * | 8/2003 | Basol et al. | 205/133 |
| 6,615,854 B1 * | 9/2003 | Hongo et al. | 134/148 |

FOREIGN PATENT DOCUMENTS

| | | |
|---|---|---|
| EP | 0 550 831 B1 | 2/1996 |
| EP | 0 699 782 A1 | 3/1996 |
| WO | WO 00/03426 | 1/2000 |
| WO | WO 01/45144 A1 | 6/2001 |

OTHER PUBLICATIONS

International Search Report, Feb. 24, 2004, PCT/US02/41415; Nutool.

* cited by examiner

*Primary Examiner*—Patrick Ryan
*Assistant Examiner*—Thomas H. Parsons
(74) *Attorney, Agent, or Firm*—Pillsbury Winthrop LLP

(57) ABSTRACT

The present invention provides an edge cleaning system and method in which a directed stream of a mild etching solution is supplied to an edge area of a rotating workpiece, including the front surface edge and bevel, while a potential difference between the workpiece and the directed stream is maintained. In one aspect, the present invention provides an edge cleaning system that is disposed in the same processing chamber that is used for deposition or removal processing of the workpiece. In another aspect, the mild etching solution used for edge removal is also used to clean the front surface of the wafer, either simultaneously with or sequentially with the edge removal process.

43 Claims, 8 Drawing Sheets

ELECTROCHEMICAL EDGE AND BEVEL CLEANING PROCESS AND SYSTEM

BACKGROUND OF THE INVENTION

1. Field of the Invention

The present invention generally relates to semiconductor processing technologies and, more particularly, to a system and process that removes a conductive layer from the edge and/or bevel of a workpiece and renders these areas free from unwanted impurities.

2. Description of the Related Art

In the semiconductor industry, various processes can be used to deposit and remove conductive materials on the wafers. Deposition techniques include processes such as electrochemical deposition (ECD) and electrochemical mechanical deposition (ECMD). In both processes, a conductor such as copper is deposited on a semiconductor wafer or a workpiece from an electrolyte that comes into contact with the surface of the wafer and another electrode. Material removal techniques include chemical etching (CE), electrochemical etching (ECE), electrochemical mechanical etching (ECME) and chemical mechanical polishing (CMP), which are used to remove the unwanted excess portions of materials from the workpiece surface.

The term of Electrochemical Mechanical Processing (ECMPR) is used to include both Electrochemical Mechanical Deposition (ECMD) processes as well as Electrochemical Mechanical Etching (ECME), which is also called Electrochemical Mechanical Polishing (ECMP). It should be noted that in general both ECMD and ECME processes are referred to as electrochemical mechanical processing (ECMPR) since both involve electrochemical processes and mechanical action on the workpiece surface.

In one aspect of an ECMPR method, a workpiece-surface-influencing-device (WSID) such as a mask, pad or a sweeper is used during at least a portion of the electrotreatment process when there is physical contact or close proximity and relative motion between the workpiece surface and the WSID. Descriptions of various deposition and etching methods, including planar deposition and planar etching methods i.e. ECMPR approaches and apparatus, can be found in U.S. Pat. No. 6,176,952 entitled "Method and Apparatus For Electro Chemical Mechanical Deposition", and U.S. application Ser. No. 09/740,701 entitled "Plating Method and Apparatus that Creates a Differential Between Additive Disposed on a Top Surface and a Cavity Surface of a Workpiece Using an External Influence," filed on Dec. 18, 2001, both commonly owned by the assignee of the present invention.

Other material deposition and removal methods are understood and need not be further described.

Regardless of the deposition or removal process used, conventionally the workpiece is transferred to some type of cleaning and drying station after processing. During the cleaning steps, various residues generated by the processing are rinsed off the workpiece, and subsequently the workpiece is dried by spinning and if necessary blowing nitrogen on its surface.

In one design, the processing chamber, in which conventional plating or removal processing or ECMPR occurs, and the rinse chamber can be stacked vertically in a vertical process chambers arrangement. In this arrangement, the processing can be performed in a lower chamber, and the cleaning and drying can be carried out in an upper chamber after isolating the upper chamber from the lower chamber so that chemicals used in either chamber do not mix with each other. One such vertical chamber is disclosed in the co-pending U.S. application Ser. No. 09/466,014, now U.S. Pat. No. 6,352,623 entitled "Vertically Configured Chamber Used for Multiple Processes", filed Dec. 17, 1999, commonly owned by the assignee of the present invention.

Conventionally, a typical processing sequence is to initially perform deposition or plating of a conductive material onto a workpiece, and thereafter remove some of the previously deposited conductive material, such as the unwanted overburden conductive material from the front face of the workpiece.

Copper is a preferred conductive material used for integrated circuit (IC) interconnects and packaging applications. ECD and ECMD processes can deposit copper. Therefore it will be used as an example.

When copper is plated on a wafer front surface, in addition to areas where there are ICs, it may also deposit on the edges and sides, i.e., bevel, of the wafer where no ICs or circuits are located. In some cases, the edge and bevel are protected from the plating solution; therefore no copper may be plated there. However, there may still be a copper seed layer on the edge regions and bevel. Whatever the source is, such remaining copper, i.e. the edge copper, may migrate to neighboring active regions from the sides and edges of the wafer, especially during an annealing step. Further, copper particles originating from a wafer edge may contaminate the wafer transport system, and other process equipment such as the annealing system etc., and so be passed on to contaminate other wafers. Poorly adhering copper flakes from the wafer edge may also cause problem during the CMP step by becoming loose and getting onto the surface areas where there are circuits. For these reasons and more, it is important to remove the copper from the edges and the bevel of the wafer following each copper plating process step.

U.S. Pat. No. 6,309,981 describes a method of removing metal from the edge bevel region of a semiconductor wafer. U.S. Provisional Application No. 60/276,103, an application assigned to the assignee of the present invention, describes a method and apparatus for removing edge copper in an upper rinsing chamber of a vertical chamber system that also includes a lower processing chamber.

In both of the above documents, the chemical removal approaches use aggressive etching solutions with oxidizers, such as sulfuric acid and hydrogen peroxide mixtures or strongly oxidizing acids such as nitric acid. Such aggressive etching solutions are designed so that the oxidizers chemically oxidize the copper and the oxidized copper dissolves in the acidic solution. To be able to obtain high process throughput the aggressive etching solutions are formulated to yield very high etching rates such as larger than 300–400 A/sec, preferably larger than 1000 A/sec, for copper. This corresponds to an etching rate of much higher than 20000 A/min. Although aggressive etching solutions and systems employing them are presently in use there are some issues associated with their utilization.

Strong oxidizers such as hydrogen peroxide are not very stable; therefore, mixing, transport and storage of the aggressive edge copper removal etchants present a challenge. For example, solutions containing hydrogen peroxide need to be shipped in breathable containers that do not allow pressure built-up in the container due to hydrogen peroxide break-up. These etching solutions also have a limited lifetime due to breakdown of the oxidizer. It is also challenging to attempt removal of material from the front face edge of the workpiece and maintain separation of the aggressive etching solution from front face portions other than the edge of the workpiece. As stated earlier, aggressive etching solutions are designed to etch copper at very high rates. Therefore any droplets inadvertently ending up on other portions of the wafer surface would etch these areas and cause oxidation and potential failure in IC's. Even the vapor of aggressive etching solutions causes oxidation and discoloration of the portions of the copper surface, especially adjacent to the edge where material removal is performed. Such oxidized regions need to be typically cleaned after the edge copper removal process, using a different acid solution with very low chemical etching rate. This makes it necessary to store and deliver yet another solution chemistry to the wafer surface and therefore adds to the cost. There is another consideration in using aggressive etching solutions specifically for vertical chamber structures such as shown in FIG. 5. In these systems the upper chamber and lower chamber are well isolated by flaps or other means of barriers. However, if there is any accidental leak and drops of the edge copper removal solution finds its way to the lower chamber, it can mix with the electroprocessing solution and cause problems.

U.S. Pat. No. 6,056,869 describes a device for deplating metal from side edges and a backside of a semiconductor wafer for chemical mechanical polishing that uses a specific electrochemical etching approach using a specific device design. In this patent, an etching solution is delivered to the whole backside of the wafer and it is used to electrochemically deplate metal from the edges and the back side while the upper side of the wafer is protected from the etchant by an inert fluid jacket.

Thus, there is a need in the semiconductor industry for systems and processes that allow for more efficient processing, including the removal of edge copper from a front face of the wafer, and removal of edge copper as part of other cleaning processes.

SUMMARY OF THE INVENTION

It is an object of the present invention to provide a method and apparatus for removing edge conductor that exists on a workpiece.

It is a further object of the present invention to provide a method and apparatus for removing an edge conductor using a directed stream of a mild etching solution applied to the edge of a workpiece.

It is a further object of the present invention to increase etching ability of a very low-etch-rate solution by passing a current through that solution and selectively delivering that solution upon an edge conductor of a wafer.

It is a further object of the present invention to provide a system that allows the same mild etching solution to remove an edge conductor and also clean the front surface of the workpiece.

It is a further object of the present invention to provide a system that allows the same mild etching solution to deposit the conductor on the front surface of the workpiece and also remove an edge conductor.

It is still a further object of the present invention to provide a system that allows for edge conductor removal, workpiece front surface cleaning, or both to be performed in the same processing chamber that is used for deposition or removal processing of the workpiece.

The above objects of the invention, among others, either singly or in combination, are achieved by the present invention by providing an edge cleaning system and method in which a directed stream of a mild etching solution is supplied to an edge area of a rotating workpiece, including the front surface edge and bevel, while a potential difference between the workpiece and the directed stream is maintained.

In one aspect, the present invention provides an edge cleaning system that is disposed in the same processing chamber that is used for deposition or removal processing of the workpiece.

In another aspect, the mild etching solution used for edge removal is also used to clean the front surface of the wafer, either simultaneously with or sequentially with the edge removal process.

BRIEF DESCRIPTION OF THE DRAWINGS

The above and other objectives, features, and advantages of the present invention are further described in the detailed description which follows, with reference to the drawings by way of non-limiting exemplary embodiments of the present invention, wherein like reference numerals represent similar parts of the present invention throughout several views and wherein.

DETAILED DESCRIPTION OF THE PREFERRED EMBODIMENT

Figure 1:
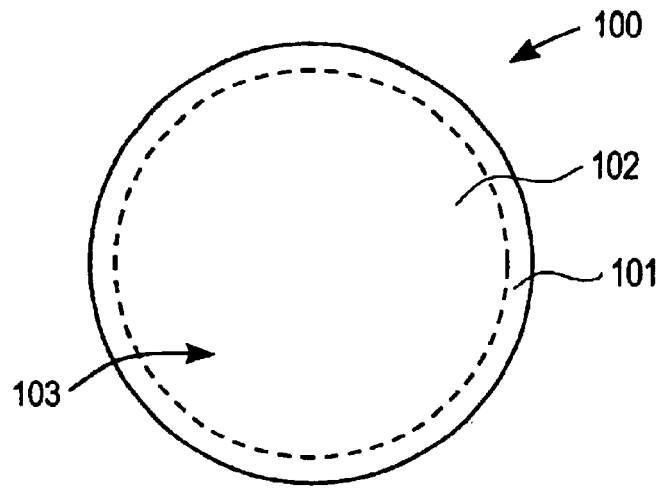
FIG. 1 illustrates a wafer on which edge removal is performed according to the present invention.

The present invention provides a solution to all of the concerns cited above. The approach of the present invention, as described hereinafter, advantageously reduces edge copper removal time and thus increases throughput without the associated problems of using even more aggressive etching solutions. The technique has the capability to use mild etching solutions without oxidizers and thus has no etchant stability problem. Conductors on the front face edges of the workpiece can be removed without the concern that other front face portions of the workpiece will be etched or otherwise affected by droplets of the etchant, because the mild etching solutions have very low chemical etching rates of less than 100 A/sec, preferably less than 50 A/sec for copper which is the example conductor. These rates correspond to an etching rate range of less than about 3000 A/min as opposed to the etching rate of much higher than about 20000 A/min for aggressive etching solutions. This is because the mild etching solutions employed in the present invention are not strong oxidizers or they do not contain an appreciable amount of strong oxidizers. An exemplary mild etching solution is a 5–10% (by weight) sulfuric acid solution in water. As will be described hereinafter, even a typical copper plating solution may be employed as a mild etching solution of the present invention. An aggressive etchant formulation with reduced amount of oxidizer may also be used in the present invention. The typical composition of an exemplary aggressive etching solution contains 3–10% (by weight) hydrogen peroxide. Chemical etching rate of this solution may be reduced by employing hydrogen peroxide concentrations of less than about 1%. What is preferable in this invention is the use of an etching solution with a chemical etching rate (without applied voltage) of less than 50 A/sec.

The etching rate of the mild etching solutions of the present invention increases only when a voltage is applied to the copper to oxidize it. Once the copper surface is oxidized by the electrochemical process, it can be removed by the mild etching solution. The etching rate of the mild etching solutions may be higher than 500 A/sec, preferably higher than 1000 A/sec in presence of an applied voltage. Etching current densities for such etching rates may be higher than 100 mA/cm2. Solutions that are compatible with the plating electrolyte may be used as the mild etching solutions so that possible accidental leaks of the edge copper removal solution into the plating electrolyte would not be an important concern for vertical chamber process modules. For example, use of a 5–15% by weight sulfuric acid solution is very attractive since this solution would be chemically compatible with the commonly used copper plating electrolytes containing sulfuric acid and copper sulfate.

It should be noted that the present invention can be used in any edge copper removal system or chamber. The vertical chamber structure and use of ECMD are given here only by way of example. The mild etching solutions do not cause oxidation of the copper surface adjacent to the edge area where edge copper removal process is carried out. Therefore an acid wash step may be completely eliminated. Even if such a step is utilized, this process step could use the same mild etching solution that is used during the step of edge copper removal, only without the applied voltage. This means further savings since it eliminates storage and delivery of a second solution to the wafer surface. In cases where the edge copper removal step is performed in a system that is integrated with the copper plating process, it is possible to use the plating electrolyte as the edge copper removal solution. This reduces costs even further.

When mild etching solutions are used in the process of the present invention droplets of the etching solution may inadvertently land on areas of the wafer other than the edge areas where copper removal is intended. This would not pose a problem in this case since the droplets would not be in physical contact with the electrode through which a cathodic voltage is applied to the solution. Without an etching current passing through the etching solution and the copper, the only etching the droplets can do is chemical etching that, as discussed, is minimal.

Figure 2:
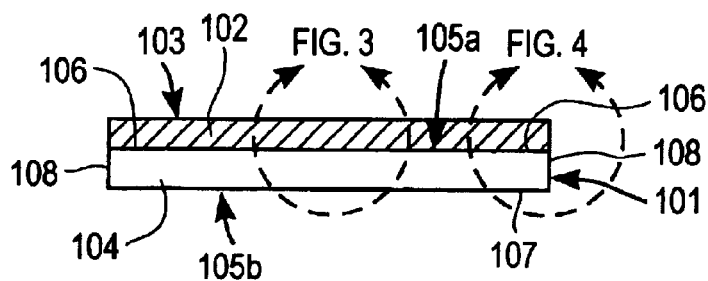
FIG. 2 illustrates a cross section of a wafer on which edge removal is performed according to the present invention.

FIG. 1 is a top plane view of a plated workpiece 100 such as a semiconductor wafer. As also shown in FIG. 2 in side view, the plated wafer 100 comprises a top layer 102 having a top surface 103 and a bottom layer 104 having an upper surface 105a and a bottom surface 105b. The top layer 102 is formed on the upper surface 105a of the bottom layer 104. A top surface edge portion 106 of the upper surface 105a of the bottom layer 104, a side surface 108 of the bottom layer and a bottom surface edge portion 107 of the bottom layer define an edge region 101 around the perimeter of the bottom layer 104. In this embodiment, the top layer 102 of the plated wafer 100 is comprised of a layer or layers of conductive material, for example copper, and the bottom layer 104 comprises a semiconductor substrate, such as a silicon substrate which may have devices, circuits and interconnect structures already fabricated into it.

Figure 3:
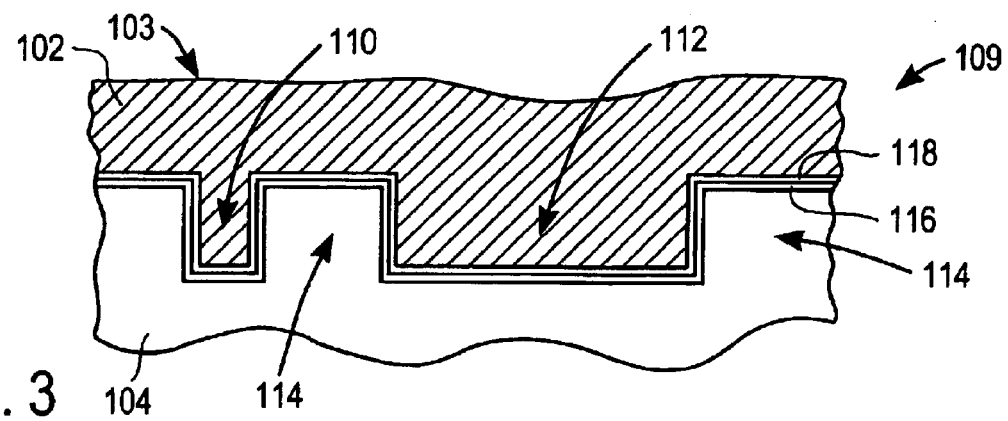
FIG. 3 illustrates a more detailed cross section of a surface portion of a wafer on which edge removal is performed according to the present invention.

FIG. 3 is an enlarged partial cross-sectional view of near top surface region 109 of the wafer 100, shown in FIG. 2, which comprises a via and a trench feature 110 and 112 formed in an insulating region 114 which is previously formed on the wafer surface. As shown in FIG. 3, the surface region 109 of the plated wafer 100 may comprise a plurality of via, trench and other features such as dual damascene features. The features 110, 112 and the surface of the insulator between the features are typically lined with a diffusion barrier/glue layer 116 and a seed layer 118, i.e., copper seed layer for the case of copper deposition. In most cases, the barrier layer 116 and/or the seed layer 118 extends onto the top surface edge portion 106, and sometimes onto the wafer side 108. In fact, one or both of these layers may wrap around and coat the bottom surface edge portion 107, thereby covering the edge region 101. Since, during the electroplating, copper only deposits on the conductive regions that are coated with barrier or copper seed layer or with a barrier/seed composite layer, this, in turn, may cause copper to deposit on the edge region 101, if the edge region 101 is exposed to the plating electrolyte. Electroplated copper layer 102 fills the vias 110 and the trenches 112 and forms the copper layer 102 on the substrate 104.

Figure 4:
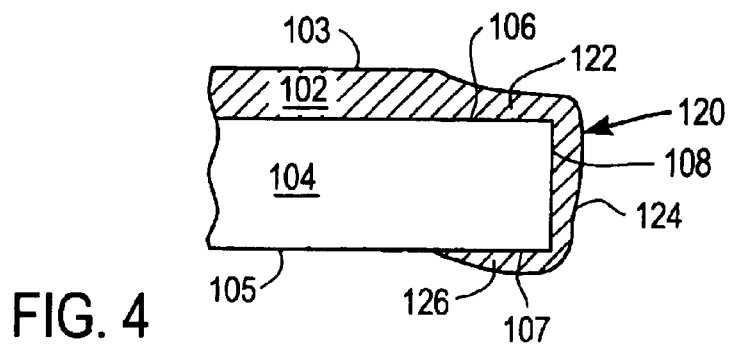
FIG. 4 illustrates a more detailed cross section of an edge portion of a wafer on which edge removal is performed according to the present invention.

As mentioned above, the copper layer 102 may also extend onto the edge region 101 and thus forming an edge copper 120 shown in FIG. 4. It should be noted that barrier/glue layer is not shown in FIG. 4 and that the edge copper 120 may be as a result of having copper seed layer on the edge region 101, and plating this region with copper when the edge region 101 is exposed to the plating electrolyte during plating. Alternatively the edge copper 120 maybe just the seed layer itself covering the edge region 101, if the edge region is protected from the plating electrolyte during the plating process using well known sealing means. The edge copper 120 may form around the whole or partial circumference of the wafer 100. As exemplified in FIG. 4, the edge copper 120 may have an upper portion 122, a side portion 124 and a lower portion 126, which are formed on the edge region 101. The edge copper portions 122–126 can be removed from the edge region 101 by applying a copper etching solution through the process of the present invention. Although, in this embodiment, the edge copper 120 is exemplified using the upper, side and lower portions, it is understood that this is for the purpose of exemplifying the problem; consequently, the unwanted copper may just have the upper portion or just the upper and side portions etc.

It should be noted that even in the case where copper may not be deposited on the top surface edge portion 106, the side surface 108 and the bottom surface edge portion 105 of FIG. 4 during the plating step, presence of the copper seed layer in those areas may exist and is typically undesirable. And, a conventional CMP step, which is carried out after the plating step, may be able to remove any copper on the top surface edge portion 106, but would not be effective in removing copper from the side surface 108 and the bottom surface edge portion 107.

Figure 5:
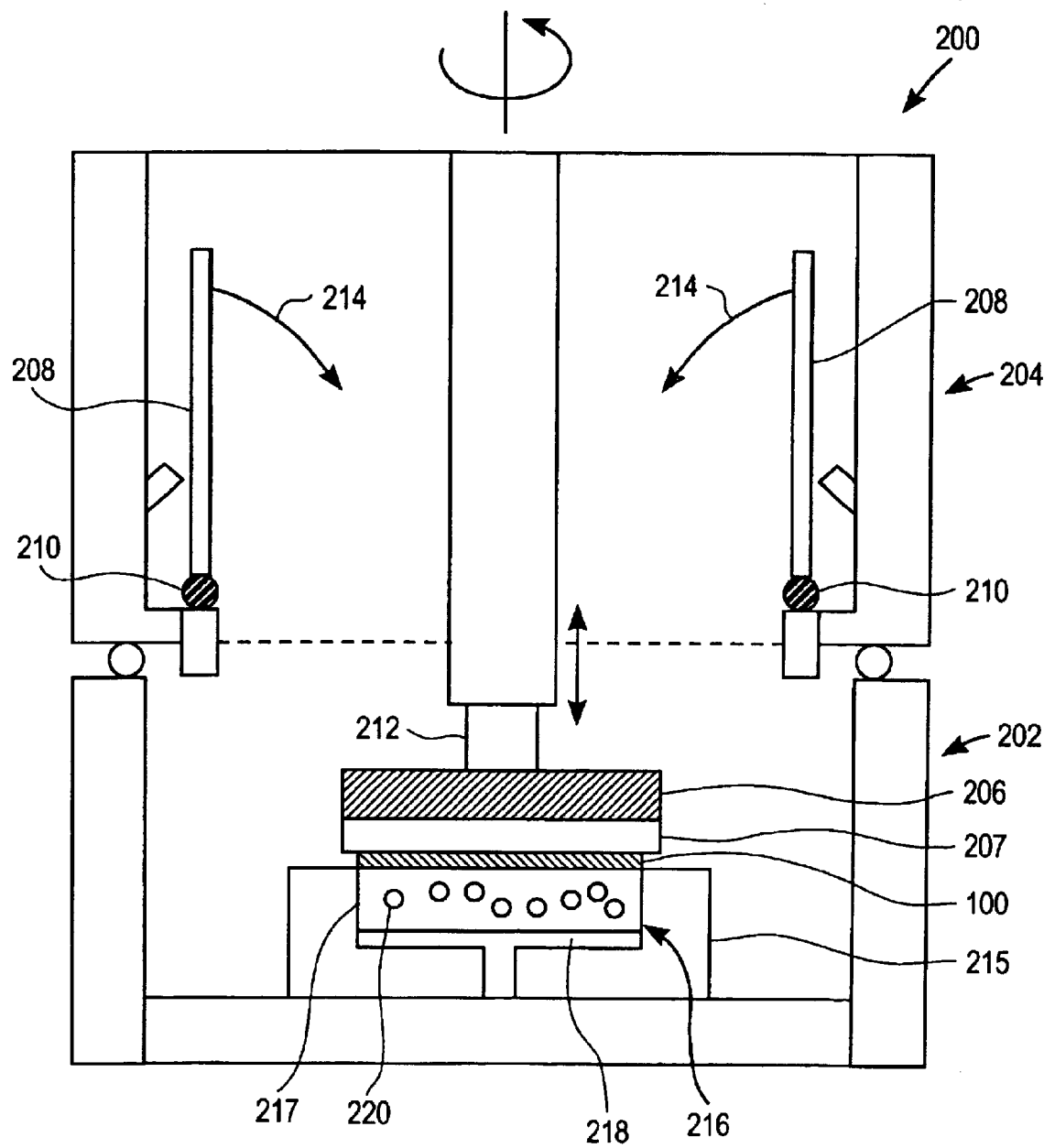
FIG. 5 illustrates a vertical chamber in which edge removal is performed according to the present invention.

The copper layer 102 may be deposited on the substrate 104 using an electroplating process and system 200 shown in FIG. 5. The system 200 may be a vertical chamber system comprising a lower section 202 and an upper section 204. One such vertical chamber system is disclosed in the co-pending U.S. application Ser. No. 09/466,014, now U.S. Pat. No. 6,352,623 entitled "Vertically Configured Chamber Used for Multiple Processes", filed Dec. 17, 1999, commonly owned by the assignee of the present invention. Although the present invention is described using a vertical chamber system, it is for the purpose of exemplifying the present invention. Embodiments of the present invention can be used with other systems, such as systems having cleaning and process chambers that are not adjacent, as well as in chambers that perform other processes as described further herein. Accordingly, according to this embodiment, an edge copper removal process is performed within the upper chamber. Thus, while the lower chamber will comprise some type of processing section, such as an ECMPR, plating or material removal system, the upper section will contain a cleaning and edge copper removal and drying section. The upper and lower sections have a movable barrier, described in one specific embodiment as guard flaps, which keep the various materials and solutions used in the processes of the upper chamber from reaching the lower chamber, as described further herein.

In one embodiment of the process, a process is initially performed on the front surface of the workpiece in the lower section 202, and in the following stage, a cleaning by rinsing may be performed in the upper section 204. As will be described more fully below, sequentially before or after, or simultaneously with the cleaning, in the upper section 204, an edge copper removal process is performed. As will be also described below in an alternative embodiment, the edge copper removal process can also be performed in the lower section when the lower section is such equipped. The edge copper removal process can, if desired, be followed by a second cleaning and drying process. Alternately, the initial cleaning step may be skipped to increase throughput. In this case cleaning and drying is done once the edge copper removal process is complete.

As shown in FIG. 5, a wafer holder 206 supports the wafer 100 as deposition process is performed in the lower section 202. The wafer holder may comprise, preferably, circular chuck 207 upon which the wafer 100 is loaded, bottom surface 105 first (see FIG. 2), and secured. Guard flaps 208 via linkage shafts/rollers 210 are positioned vertically such that the wafer holder 206 using a shaft 212 can be lowered into the lower section 202. The shaft 212 is further adapted to move side to side and to rotate about the vertical axis of the shaft 212. During the cleaning, edge copper removal and drying, the wafer holder 206 is raised vertically into the upper section 204 and the flaps 208 are closed by moving them in the direction of the arrows 214.

During an ECMPR, as mentioned above, the wafer 100 is operated upon (see also FIG. 3). For example, an ECMD process can be used to form a generally flat copper layer over the features. An ECMPR apparatus 215 may comprise a wafer surface influencing device (WSID) assembly 216 having a WSID 217 such as a pad having asperities 220, and an electrode 218 immersed in a solution, which can be an electrolyte solution if either ECMD or ECME is used, an etching solution if only ECME is performed, and other solutions if other depositing or removal methods are used.

An electrolyte solution used in an ECMD process will contain ions of a metal being deposited, such as copper, and touches a plating electrode (not shown) and the wafer 100 by flowing through the WSID 217. An exemplary copper plating solution may be a copper sulfate, sulfuric acid solution which is commonly used in the industry and which may also contain additives such as accelerators, suppressors, chloride and in some cases levelers. During electroprocessing, the top surface 103 of the wafer 100 is brought into close proximity, which can be slightly spaced from or preferably in contact with, the WSID 217 while a potential difference applied between the plating electrode and the wafer surface.

Figure 6:
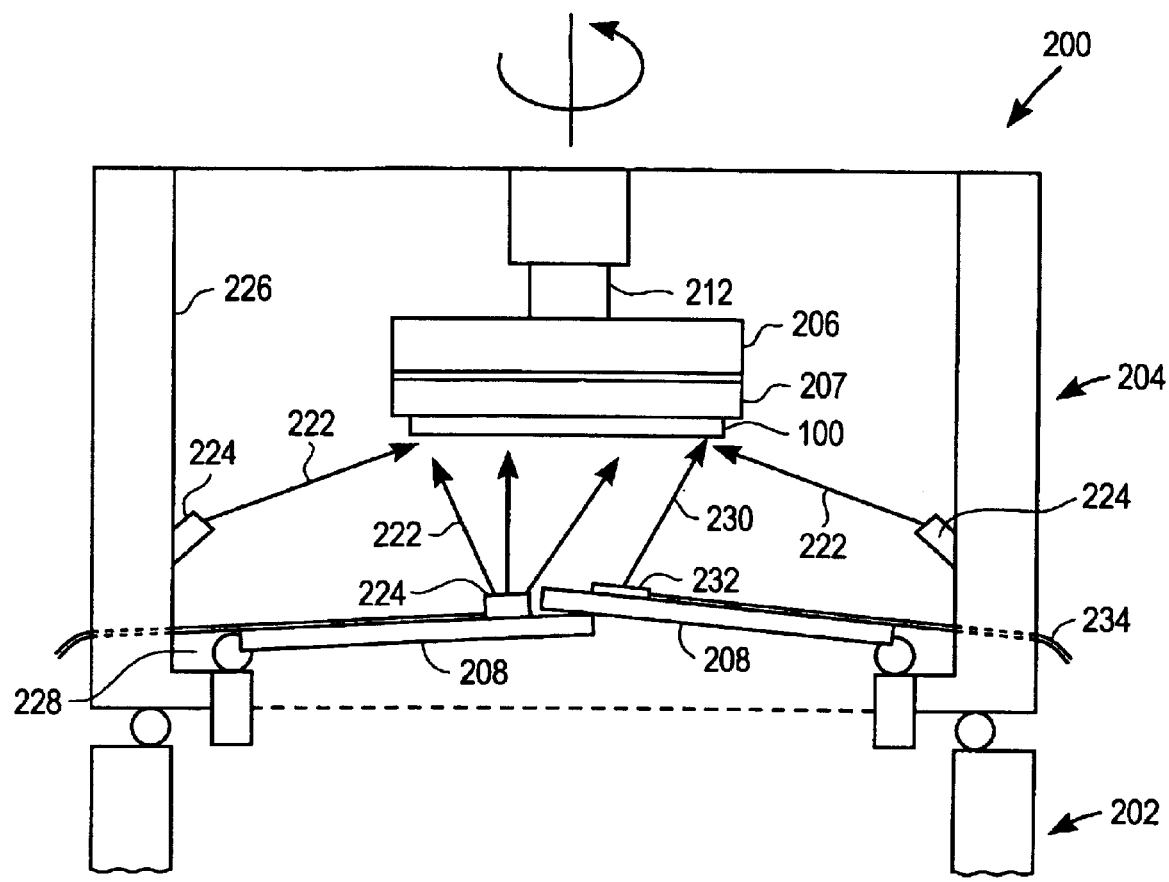
FIGS. 6 and 7 illustrate the edge removal apparatus of the present invention in further detail.
Figure 7:
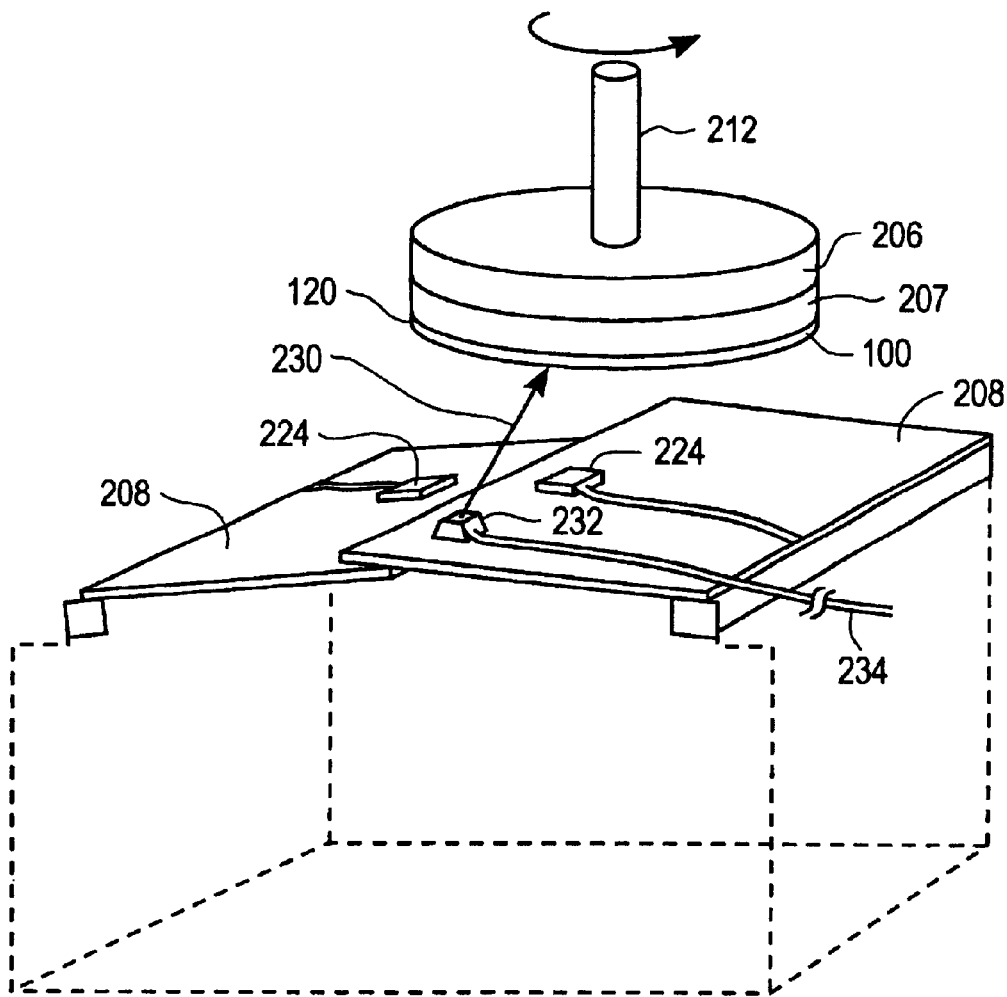

As shown in FIGS. 6 and 7, after the processing takes place in the lower section 202 of the system 200, the wafer holder 206 is raised using the shaft 212. Then, the flaps 208 are moved from their vertical position to their horizontal position to separate the lower section 202 from the upper section 204. Once the flaps 208 are in closed position the cleaning is carried out. During the cleaning by rinsing, the holder 206 may be lowered towards the flaps 208.

In one embodiment, a stream of a cleaning solution, depicted by the arrows 222, may be provided through nozzles 224 that are located on the side walls 226 of the upper section and/or on the flaps 208. Used cleaning solution is drained out of the section 204 using outlet channels 228 along the side walls 226 as schematically shown in FIG. 6. This solution does not mix with the electrolyte in the lower section 202 due to the presence of the flaps 208 in the closed position. During the cleaning step, the wafer 100 is rotated and the cleaning solution is applied to the wafer 100. The wafer 100 may be spin-dried by rotating the wafer at high rpm. Additionally, clean and dry air or inert gas like nitrogen may also be blown on the wafer to help dry it.

After the cleaning and drying processes, edge copper removal process is performed in the same upper chamber 204, using a stream of a mild etchant, as will be described hereinafter. Alternately, after the workpiece processing is completed in the lower chamber 202, the wafer is moved up by the shaft 212 so that wafer surface does not touch the solution in the lower chamber. However wafer still remains in the lower chamber 202. A high rpm spin of wafer (typically 200–1000 rpm) removes the excess solution, such as an electrolyte, from the surface of the wafer and dries the surface. The wafer is then raised to the upper chamber 204 for edge copper removal process. Cleaning and drying steps are performed after edge copper removal.

Yet another alternate processing sequence involves rinsing the wafer surface in the upper chamber 204 after the plating step. Edge copper removal is then performed without the spin-dry step. Edge copper removal is then followed by rinsing and drying steps. These alternate process sequences aim at reducing process times and increasing throughput.

Figure 9:
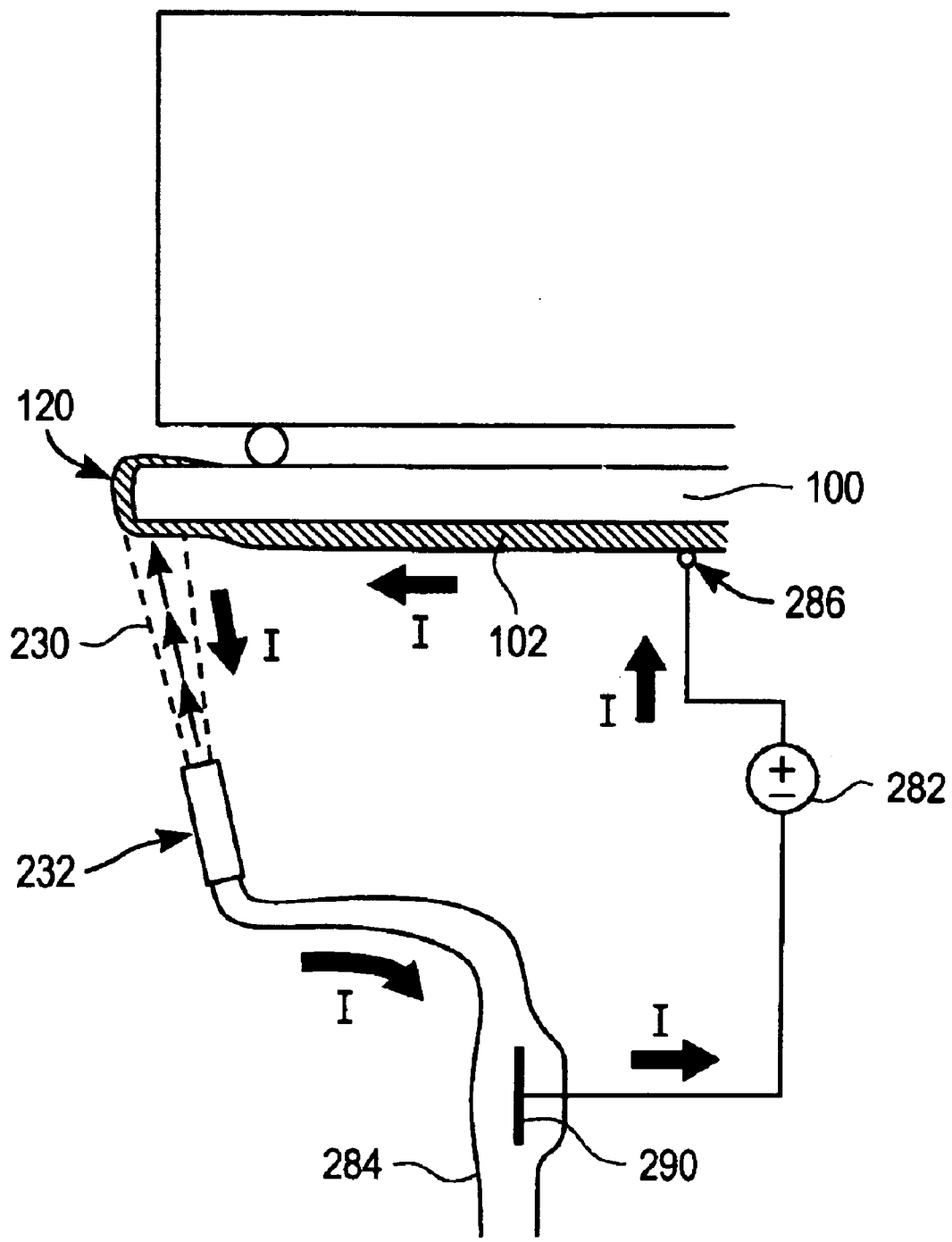
FIG. 9 illustrates in further detail edge removal according to the embodiment of the invention illustrated in FIGS. 6 and 7.

Referring to FIGS. 6 and 7, during the edge copper removal, a stream of mild etching solution, depicted by the arrow 230, is applied on the edge copper 120 while the wafer 100 is rotated at approximately 20 to 1000 rpm, preferably at 50 to 500 rpm. Further, as shown in FIG. 9 in more detail a potential difference, shown as (+) and (−), is created between the stream and the workpiece, which allows for the mild etching solution to perform metal removal at the edge and bevel regions of the workpiece in an amount of time that is much less than that which could occur without the use of the applied potential difference. The potential is applied between the wafer surface containing copper film and an etching electrode that is in physical contact with the mild etching solution. Electrical contact may be made to the wafer surface through various means including through a stationary contact that slides on the wafer surface as the wafer is rotated. The etching electrode may be made of any conductive material that is stable in the mild etching solution that it touches. Platinum coated metals and titanium are etching electrode materials.

As pointed out previously, by mild etching solution is meant a solution, which, without application of the potential difference, only provides minimal etching. The etching rate of such mild etching solutions may be less than 100 A/sec, preferably less than 50 A/sec. Therefore, these solutions are not useful for standard edge copper etching applications. To remove an edge copper layer of, for example, 2000 A using such a mild etching solution, a process time of more than 40 seconds would be needed. To remove a thicker layer of, for example, 1 micron, the processing time would be prohibitively long. Alternately, when such a solution is used as in the present invention in the presence of an applied voltage, much shorter processing times can be achieved since etching rates may be higher than 1000 A/sec, depending upon the voltage applied, temperature of the solution and the exact chemical composition of the solution. If during processing some mild etching solution spills on the wafer surface away from the edge, it would etch only a small amount of material based on the zero-voltage (chemical) etching rate. Referring to FIG. 7, the mild etching solution is applied in the form of a regulated stream through at least one nozzle 232 that is preferably mounted on the flaps 208 or otherwise located relative to the wafer 100 such that the nozzle 232 directs a stream of the mild etching solution toward the wafer 100 in a manner that the stream has a horizontal component that is directed away from the center of the wafer 100, thus assisting with keeping the solution away from the central portion of the wafer, but on the edge copper 120.

The mild etching solution can be fed to the nozzle 232 through a feed tube 234 that is connected to a feed pump (not shown). The nozzle 232 directs the solution to the edge or perimeter of the wafer as a tightly controlled stream. The etching solution can be applied in various amounts for various periods of time, preferably in a range of 1 to 10 ml per second for approximately 5 to 10 seconds. Owing to both centrifugal force generated by the spinning wafer and the surface tension of the solution, the solution arrives at the edge of the wafer at an angle and the stream of solution that is outwardly directed to the upper portion 122 of the edge copper 120 flows over the portions 124 and 126 of the edge copper 120 and covers them (see FIG. 4). The angle at which the mild etching solution strikes the edge copper 120 can also be varied, which allows for narrowing or broadening of the etched region, which is the edge region 106. The width of the edge region 106 can also be changed by moving the wafer and/or the nozzle laterally or vertically. If the nozzle is constantly kept at a given angle, the etched region may be narrowed or broadened by moving the wafer up and down or moving it laterally. Similarly if the wafer is kept in the same lateral position and same elevation (but rotated), the etched region can be broadened or narrowed by varying the angle of the nozzle with respect to the wafer. As long as the above given process works in the manner described, the nozzle may be positioned on the walls or other places, and within the scope of the invention. As will be exemplified below, in an alternative embodiment, the same electrochemical removal process can be carried out in the lower chamber 202, shown in FIG. 5, when the lower chamber 202 is such equipped.

Figure 8:
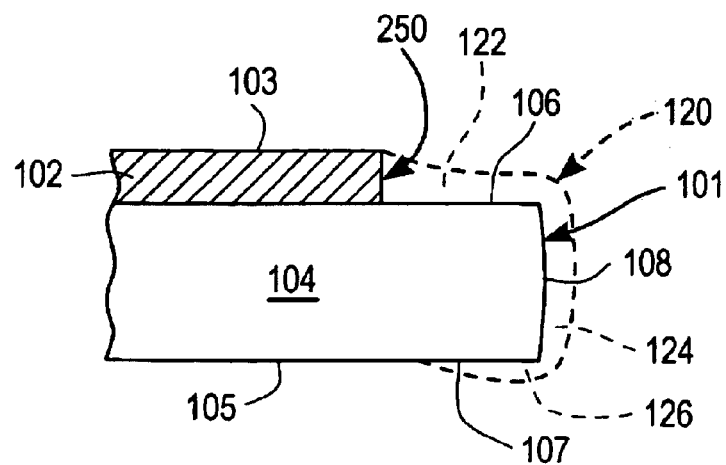
FIG. 8 illustrates an edge portion of a wafer that has had copper removed therefrom according to the present invention.

As shown in FIG. 8, accordingly, the mild etching solution under the applied potential difference etches and removes the edge copper portions 122–126 from the top surface edge portion 106, side surface 108 and the edge portion 107, thereby revealing the edge region 101. Referring to FIG. 8, the removal process of the present invention leaves a copper end wall 250 adjacent the edge region 101. After the etching process, the wafer is cleaned and dried.

Thus, in accordance with the principles of the present invention, the edge copper is electrochemically removed using a mild etching solution. In comparison to the chemical removal or etching processes, electrochemical removal of the edge copper may be faster. Another advantage of the electrochemical edge copper removal is that the process can use mild etching solutions, the standard edge copper removal solutions, as well as diluted versions of the standard edge copper removal solutions which contain oxidizers. The preferred method is to use mild etching solutions.

A unique feature of the present invention is its ability to use a plating solution as the mild etching solution for edge copper removal. For this purpose, any kind of plating solution can be used. In this embodiment, an exemplary mild etching solution used for edge copper removal may be a copper plating solution comprising 10–200 gm/l sulfuric acid and 15–50 gm/l Cu. This solution may also contain at least one of the commonly used plating additives including chloride, accelerators, suppressors and levelers. If the edge copper removal is performed in the upper chamber of the system of FIG. 5, an accidental leakage of this solution into the plating solution used in the lower chamber will not affect the quality of the plating solution since they are both the same solution.

FIG. 9 shows in more detail the edge removal system and process. The numbering of various components is the same as in FIGS. 6 and 7. The mild etching solution 230 contacts the edge copper 120. At least one contact element 286 is connected to a positive terminal of a power supply 282, and it may touch anywhere on the copper layer 102. Contact elements 286 may be made of conductive brushes or wires. The negative terminal of the power source 282 is connected to an etching electrode 290, which is in physical contact with the mild etching solution. During the process, upon application of voltage from the power source 282, a current is passed through the circuit indicated by bold arrows I. It should be noted that the mild etching solution 284 flows in the form of a well regulated stream as indicated by arrows and it acts as a conductor in this circuit through which the etching current passes. Therefore, it is very important that the stream be continuous. Otherwise etching would not take place at the increased rate. The nozzle 232 can be an electrically conductive nozzle, receiving the solution 230 through a solution conduit 284. In this case the nozzle may be the etching electrode and the negative terminal of the power source 282 may be directly connected to the body of the nozzle. Alternatively, as shown in FIG. 9 the nozzle 232 can be made of insulating materials. In this case, an etching electrode 290 touching the solution 230 may be connected to the negative terminal of the power supply 282. In either way, due to the negative voltage on the etching electrode, a copper accumulation may occur on the surface of the etching electrode after multiple edge copper removal procedures. Therefore, they may have to be periodically cleaned to remove copper deposits accumulating on them. This cleaning may be chemical or electrochemical in nature. The nozzle 232 can be for example located on the flaps or on the chamber side walls. The power supply may be a power supply used for electrodeposition in the vertical chamber system or a power supply solely used for the edge copper removal process. However, if a power supply of the vertical chamber system is used, the power supply can be available in a shared manner for both processes such that the power supply can be used for the edge copper removal process when it is not used for the plating.

During the electrochemical edge copper removal, the mild etching solution 230, depicted by the arrows in FIG. 9, is applied on the edge copper of the wafer 100 while the wafer 100 is rotated at approximately 20 to 1000 rpm, preferably at 50 to 500 rpm. The mild etching solution is applied in the form of a well-regulated and continuous stream through the nozzle 232. Preferably, the stream of the mild etching solution may have a diameter of 0.5 mm to 2 mm, preferably 1 mm. Once the power is applied to the contact elements and the etching electrode or nozzle, edge copper 120 is electrochemically removed. As previously mentioned, during the removal due to both the surface tension of the removal solution and the rpm of the wafer, the solution wraps around the edge copper and etches the edge copper uniformly, rendering the edge region 101 of the wafer 100 shown in FIG. 8. At this point, the rpm of the wafer should be optimized to render the edge profile shown in FIG. 8. If the rpm of the wafer is too high, the solution will not wrap around the edge and as a result the edge removal will not be successful. On the other hand, if the rpm is too low, the solution will extend more towards the center of the wafer and potentially result in thinning of the copper layer adjacent edge region 101, which is an unwanted situation.

As indicated before, use of mild etching solutions and electrochemical nature of the process provide several advantages against the prior edge copper removal processes. Adding to the benefits described above, as opposed to the prior art aggressive etching solutions, during an accidental splash of the mild etching solution over the copper layer, the damage inflicted by the mild solution is very insignificant. As is understood, the discontinuity in the electrical component of the electrochemical process, during the splash, simply takes away the mild solution's enhanced etching ability. Another advantage of the process is that the removal process can be carried out in either a voltage controlled manner or a current controlled manner. Both techniques allow an operator to monitor the removal process and stop it when the end point is detected, that is, when the edge copper is removed. For example, if the voltage control is selected, a sharp decline in the current used by the removal process may reveal the edge copper removal endpoint and the process is halted at this point. Alternatively, if the current control is selected, a sharp increase in the voltage used by the process indicates the edge copper removal endpoint.

In this embodiment, in order to provide better solution wrap-around, the nozzle may be positioned above the level of wafer 100 and slightly angled towards the edge copper 120.

Figure 10A:
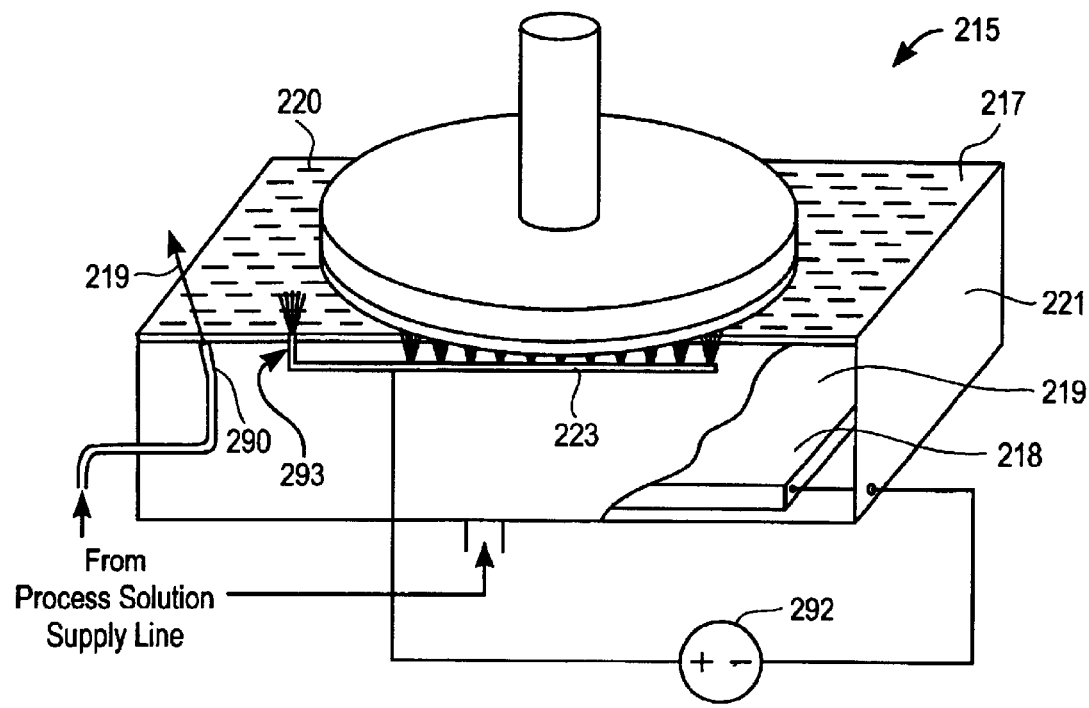
FIGS. 10A and 10B illustrate an apparatus that can be used for both ECMPR and edge removal processes according to the present invention.
Figure 10B:
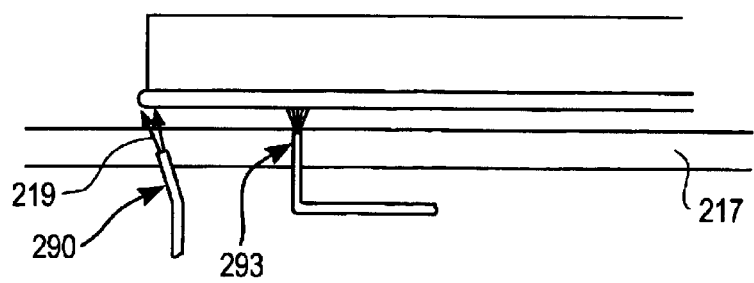

Because the solution used for edge bevel removal is a mild solution in certain circumstances the edge bevel removal can occur in the same processing chamber that operates to deposit or remove material from the front face of the workpiece. FIGS. 10A–10B show an alternative embodiment that performs the electrochemical edge copper removal in the lower section 202 of the system 200 shown in FIG. 5. As mentioned before, the ECMPR apparatus 215 comprises the WSID 217 having asperities 220, the electrode 218 immersed in a process solution 219. The process solution 219 is held in a cavity 221 on which the WSID is placed. As mentioned above, during an ECMPR, surface of the wafer is wetted by the process solution flowing through the WSID 217 while an electrical potential is established between the surface of the wafer 100, which is being processed and which is in proximity of the WSID 217, and the electrode 218. In this embodiment, the process solution 219 is a process solution that can be used both for example a plating process and a subsequent electrochemical edge copper removal process, although it is understood that an etching process instead of a deposition process could also be performed. For both processes the process solution 219 is delivered from a process solution supply tank (not shown). During the process, electrical contact to the wafer surface can be established through contacts 223 placed adjacent the WSID 217. The contacts moveably contact the exposed edge of the wafer while the wafer moves over the WSID. The contacts 223 are typically conductive brushes such as described in, for example, U.S. Provisional Application entitled "Method and System to Provide Electrical Contacts for Electrotreating Processes, filed on Sep. 12, 2001 and bearing attorney reference number 042496/0269247.

As illustrated in FIG. 10A, in this embodiment, the ECMPR apparatus 215 is equipped with an electrochemical edge copper removal device 290 that may be a nozzle. The nozzle is connected to the same process solution supply tank that is mentioned above thereby in electrical contact with the electrode 218. This electrical connection with the electrode 218 of the system 200 eliminates the need for a conductive nozzle or a nozzle containing a special etching electrode when performing the electrochemical edge removal process, both requiring connection to a negative terminal of a power supply 292 of the system 200. Instead the electrode 218 which is used for plating (or removal) is also used as the etching electrode for edge copper removal process. Of course, using such conductive nozzles or nozzles having special etching electrodes are within the scope of the present invention.

During the electrochemical edge copper removal process, required positive electrical contact to the wafer surface may be established using a contact element that is already electrically connected to the contacts 223 of the ECMPR apparatus 215. In this case, the level of the process solution 219 within cavity 221 is lowered so that an electrical path through the solution 219 to the front face of the wafer 100 through the solution 219 within the cavity 221 does not exist, thereby ensuring that the only conductive path through the solution 219 to the wafer 100 that exists is the path through edge copper removal device 290. Alternately contact 293 may be isolated and its electrical connection to the power supply 292 may be achieved through a switch (not shown). With the alternate configuration, referring back to FIGS. 10A and 10B, the contact element 293 may be a conductive brush located in the vicinity of the nozzle 290. Both the brush 293 and the nozzle 290 may be placed in an appropriate location around the WSID so that they do not have any physical contact with the wafer during the period when plating (or removal) is occurring. The brush 293 may have longer strands than the strands of the contacts. Such longer strands can establish contact with the surface of the wafer when the wafer is elevated above the WSID and moved over the area where the nozzle and the brush 293 are located, for the edge copper removal process. During this edge copper removal process, the only electrical path that exists from the solution 219 to the wafer 100 is through the edge copper removal device 290.

As shown in FIG. 10B, as the wafer, which is copper plated during the previous ECMPR process, is moved in the proximity of the edge copper removal device 290, the brush 293 touches the surface. The mild etching solution 219 is applied upon the edge copper as in the manner described above. After the copper deposition (or removal) process it is best to move the wafer away from the WSID and the plating solution and spin it to drive the excess solution from its surface. Then wafer is moved to the new position to carry out the edge copper removal step. Using the plating solution as the edge copper removal solution is very attractive because it eliminates the need to store and deliver multiple solutions for multiple purposes (plating or edge copper removal).

Figure 11:
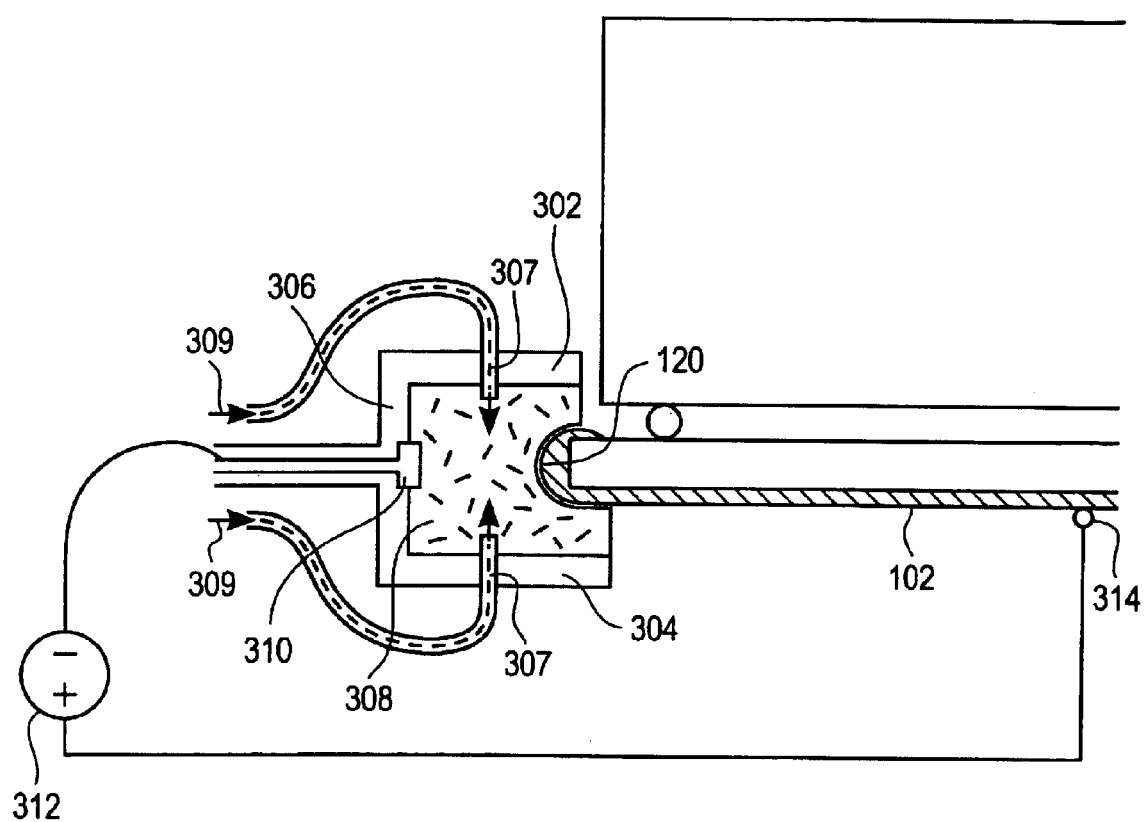
FIG. 11 illustrates in further detail edge removal according to another embodiment of the invention.

As shown in FIG. 11, in another embodiment, an edge copper removal apparatus 300 may comprise a rectangular 'U' shaped body having an upper arm portion 302 and a lower arm portion 304 connected to one another with a base portion 306. Solution inlet ports 307 are connected to the upper and lower arms to deliver a mild etching solution to a solution holding member 308 placed into the U-shaped body. The base portion 306 of the apparatus 300 contains an electrode 310, which is connected to a negative terminal of a power source 312. The holding member 308 is preferably a soft spongy material, which can be saturated with the mild solution delivered through the ports. When the holding member is pressed against the edge copper 120, it wraps around the edge copper and conveys the mild solution to the edge copper 120. At least one contact element 314, which is connected to a positive terminal of a power supply 310, may touch anywhere on the copper layer 102. The mild etching solution is applied on the edge copper 120 while the wafer 100 is rotated. As a result edge copper is etched from the edge of the wafer.

Figure 12:
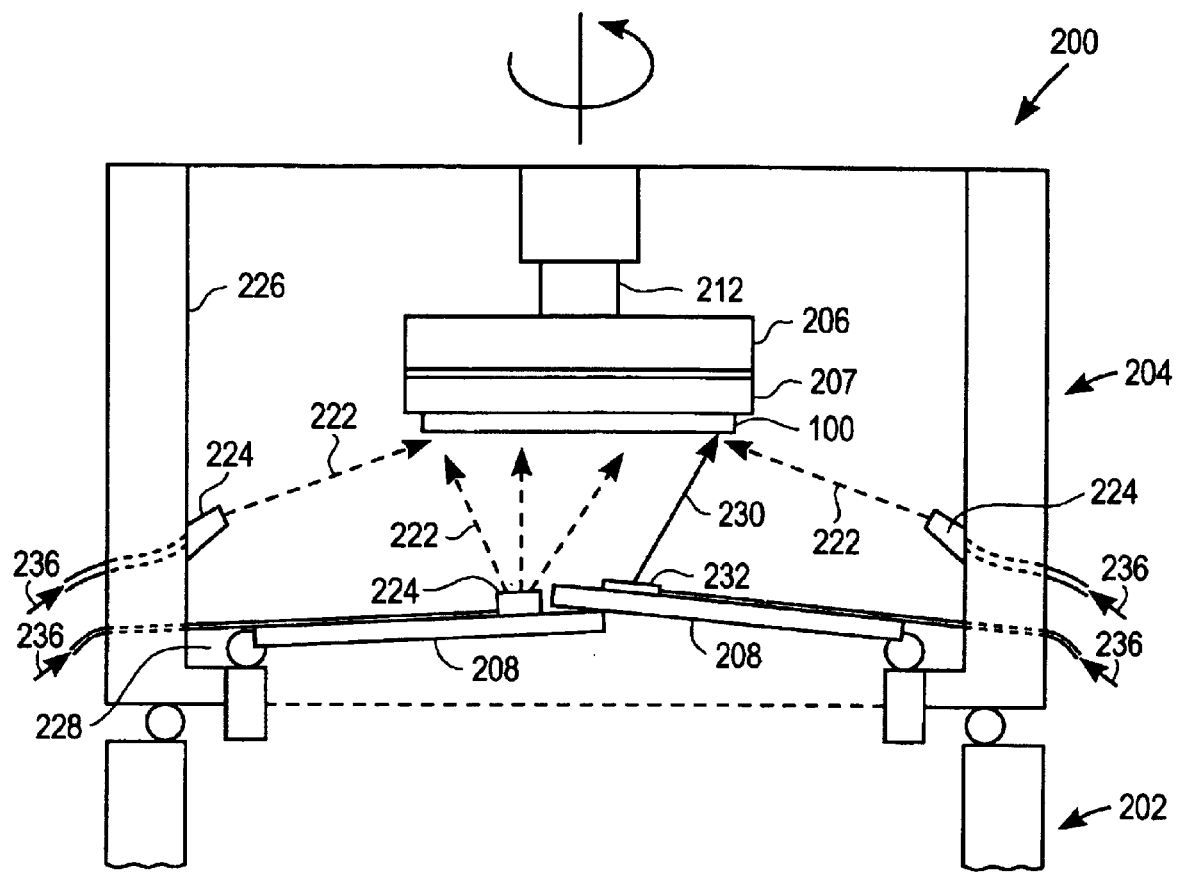
FIG. 12 illustrate an apparatus that can be used for both workpiece cleaning and edge removal processes according to the present invention.

FIG. 12 illustrates another embodiment, in which the same solution is used for both edge bevel removal and for cleaning the front face of the wafer. FIG. 12 is illustrated for purposes of this description as being a modification of FIG. 6, described previously. It is noted, however, that the system described herein need not be used in an upper chamber of a vertical chamber processing system, although there are advantages to using it in such location, and as a result it is so described. Since the same solution is suited for edge bevel removal, that solution is used to feed both nozzle(s) 232, as well as nozzle(s) 224 from a single supply source, indicated by the arrow 236. While the same supply source is used, there may be different pumps for different nozzles, or a single pump and different types of nozzles, such as nozzles 232 that provide a continuous stream and nozzles 224 that provide a mist. As illustrated, however, while there is a stream of solution that is emitted from nozzle 232 in order to perform edge bevel removal as described above, the solution that is emitted from nozzle 224 is emitted as a spray, with droplets, but avoiding a stream. By using a stream of the solution for edge bevel removal, including the front face edge, but only droplets on the remaining front face of the workpiece, etching will occur much more rapidly on the edge bevel region due to the electrical path that the stream maintains, which electrical path cannot be maintained by the droplets.

Although various preferred embodiments have been described in detail above, those skilled in the art will readily appreciate that many modifications of the exemplary embodiment are possible without materially departing from the novel teachings and advantages of this invention.

What is claimed is:

1. A method of removing a conductive material from a bevel edge of a conductive layer of a workpiece, including a front edge surface of the conductive layer, using an etching solution and an etching electrode in contact with the etching solution comprising the steps of:
    holding a backside of the workpiece using a workpiece carrier;
    rotating the workpiece;
    directing a continuous stream of the etching solution to the bevel edge of the workpiece, including the front edge surface of the conductive layer, while rotating the workpiece; and
    applying a potential difference between the electrode and the conductive layer of the workpiece while step of directing occurs.

2. The method according to claim 1, wherein the etching solution etches the bevel edge more as a result of the applying of the potential difference than would occur without the application of the potential difference.

3. The method according to claim 1, wherein the etching solution is a solution for plating and removal.

4. The method according to claim 3, further including the step of depositing the conductive layer on a front surface of the workpiece using the solution prior to the step of directing.

5. The method according to claim 4, wherein the step of depositing takes place with the workpiece disposed in a lower chamber of a vertical chamber assembly, and the steps of directing and applying take place with the workpiece disposed in an upper chamber of the vertical chamber assembly, and further including the step of moving the workpiece from the lower chamber to the upper chamber after the step of depositing and before the step of directing.

6. The method according to claim 5 wherein the step of depositing uses an electrochemical mechanical deposition process.

7. The method according to claim 4 wherein the steps of depositing and directing both take place with the workpiece disposed in a single chamber.

8. The method according to claim 4 wherein the steps of depositing and directing both take place with the workpiece disposed in different respective chambers.

9. The method according to claim 3, further including the step of performing an electrochemical mechanical processing on a top surface of the conductive layer of the workpiece prior to the step of directing.

10. The method according to claim 9, wherein the step of performing electrochemical mechanical processing takes place with the workpiece disposed in a lower chamber of a vertical chamber assembly, and the steps of directing and applying take place with the workpiece disposed in an upper chamber of the vertical chamber assembly, and further including the step of moving the workpiece from the lower chamber to the upper chamber after the step of performing electrochemical mechanical processing and before the step of directing.

11. The method according to claim 9 wherein the steps of performing electrochemical mechanical processing and directing both take place with the workpiece disposed in a single chamber.

12. The method according to claim 9 wherein the steps of performing electrochemical mechanical processing and directing both take place with the workpiece disposed in different respective chambers.

13. The method according to claim 1, further including the step of removing a conductive material from the conductive later on a front surface of the workpiece using the etching solution prior to the step of directing.

14. The method according to claim 13 wherein the step of removing uses an electrochemical mechanical removal process.

15. The method according to claim 13, wherein the step of removing takes place with the workpiece disposed in a lower chamber of a vertical chamber assembly, and the steps of directing and applying take place with the workpiece disposed in an upper chamber of the vertical chamber assembly, and further including the step of moving the workpiece from the lower chamber to the upper chamber after the step of removing and before the step of directing.

16. The method according to claim 13 wherein the step of depositing uses an electrochemical mechanical deposition process.

17. The method according to claim 1, further including the step of spraying a mist of the mild etching solution onto a top surface of the conductive layer.

18. The method according to claim 17 wherein the steps of spraying and directing both take place with the workpiece disposed in a single chamber.

19. The method according to claim 18 wherein the steps of spraying and directing both take place at the same time.

20. The method according to claim 18 wherein the steps of spraying and directing take place sequentially.

21. An apparatus for performing an edge bevel removal process on a front conductive surface edge of a conductive material on a workpiece comprising:
   a chamber;
   a moveable and rotatable workpiece holder that holds a backside of the workpiece and rotates the workpiece;
   at least one edge conductor material removal device for supplying a continuous stream of solution toward at least the front conductive surface edge of the workpiece;
   first electrode configured to be electrically coupled to the continuous stream of the solution:
   a second electrode configured to be electrically coupled to the conductive material; and
   a power source configured to apply a potential difference between the first electrode and the second electrode.

22. The apparatus according to claim 21, wherein the at least one edge conductive material removal device comprises at least one nozzle disposed within a position relative to the workpiece such that a continuous stream of the solution is directed outwardly toward the front conductive surface edge of the workpiece.

23. The apparatus according to claim 21 further including at least a cleaning nozzle disposed within the chamber configured to direct a second solution to a front surface of the workpiece.

24. The apparatus according to claim 23 wherein the second solution and the solution are the same.

25. The apparatus according to claim 21 further including:
   another chamber disposed below the chamber;
   a moveable guard adapted to separate the another chamber from the chamber when the workpiece is in the chamber and the at least one edge conductor material removal device is being used; and
   a system for processing a front surface of the workpiece disposed in the another chamber.

26. The apparatus according to claim 25 wherein the system is an electrochemical mechanical processing system.

27. The apparatus according to claim 26 wherein the electrochemical mechanical processing system is an electrochemical mechanical deposition system.

28. The apparatus according to claim 21 further including an electrochemical mechanical processing system disposed within the chamber for providing electrochemical mechanical processing on a front surface of the workpiece.

29. The apparatus according to claim 21, wherein:
   the first electrode is configured to provide an electrical communication with the conductive material on the workpiece through the solution; and
   the potential difference applied between the first electrode and the second electrode provides an electrochemical process of a conductive material on substantially an entire surface of the workpiece.

30. The apparatus according to claim 29 further comprising a cavity configured to enclose the first electrode.

31. The apparatus according to claim 29, wherein the first electrode is immersed in the solution.

32. The apparatus according to claim 29, wherein the second electrode includes a plurality of terminals configured to physically contact the conductive material on the workpiece.

33. The apparatus according to claim 29, wherein the first electrode is used for both the electrochemical process and the edge bevel removal process.

34. The apparatus according to claim 29, wherein the edge conductor material removal device comprises at least one nozzle disposed in a position relative to the workpiece such that a continuous stream of the solution is directed outwardly toward the front conductive surface edge of the workpiece.

35. The apparatus according to claim 29 wherein the solution is for placing or removal and is configured to provide electrochemical mechanical processing.

36. The apparatus according to claim 29 further including a fluid controller configured to adjust a level of the solution in the chamber to alter the electrical communication between the first electrode and the conductive material on the workpiece, wherein a first level is configured to provide an electrical connection to the first electrode via the continuous stream of the solution during the edge bevel removal and a second level is configured to provide the electrical communication though the solution during the electrochemical process.

37. A method of performing edge bevel removal on a workpiece and cleaning of a front face of a workpiece using a solution comprising the steps of:
   holding a backside of the workpiece in a workpiece carrier;
   rotating the workpiece;
   directing a continuous stream of the solution to a bevel edge of a conductive layer of the workpiece while rotating the workpiece to electrochemically remove conductive material from the bevel edge at a first rate; and
   directing a spray of the solution to the front face of the workpiece while rotating the workpiece to etch the front face of the workpiece at a second rate.

38. The method according to claim 37 wherein the steps of directing the stream and directing the spray are performed sequentially.

39. The method according to claim 37 wherein the steps of directing the stream and directing the spray are performed simultaneously.

40. The method according to claim 37 wherein while the step of directing the continuous stream occurs, a potential difference between the continuous stream of the solution and the conductive layer of the workpiece is applied, and wherein the spray is incapable of providing an electrical path to the conductive layer, thereby ensuring that any removal of the conductive material from the front face of the workpiece occurs at the second rate that is less than the first rate.

41. The method according to claim 40 wherein the solution is a solution for plating or removal material.

42. The method according to claim 40 wherein the steps of directing the stream and directing the spray are performed sequentially.

43. The method according to claim 40 wherein the steps of directing the stream and directing the spray are performed simultaneously.

* * * * *